(12) United States Patent
Tamura (10) Patent No.: US 7,485,473 B2
(45) Date of Patent: *Feb. 3, 2009

(54) METHODS FOR FORMING SEMICONDUCTING DEVICE WITH TITANIUM NITRIDE ORIENTATION LAYER

(75) Inventor: Hiroaki Tamura, Fujimimachi (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/464,214

(22) Filed: Aug. 14, 2006

(65) Prior Publication Data

US 2007/0042543 A1 Feb. 22, 2007

(30) Foreign Application Priority Data

Aug. 17, 2005 (JP) ............................... 2005-236258

(51) Int. Cl.
 H01L 21/00 (2006.01)
 H01L 21/469 (2006.01)
 H01L 21/20 (2006.01)
 H01L 21/8242 (2006.01)

(52) U.S. Cl. .......................... 438/3; 438/253; 438/396; 438/785; 438/798

(58) Field of Classification Search .................. 438/3
 See application file for complete search history.

(56) References Cited

U.S. PATENT DOCUMENTS

| | | | |
|---|---|---|---|
| 5,703,403 A * | 12/1997 | Sobue et al. ................. 257/751 |
| 6,333,534 B1 * | 12/2001 | Chen .......................... 257/303 |
| 6,342,425 B1 | 1/2002 | Joo |
| 6,485,988 B2 * | 11/2002 | Ma et al. ......................... 438/3 |
| 6,635,528 B2 * | 10/2003 | Gilbert et al. ............... 438/253 |
| 6,710,384 B2 * | 3/2004 | Igarashi ...................... 257/295 |
| 2002/0047147 A1 * | 4/2002 | Kushida et al. ............. 257/295 |
| 2003/0129771 A1 * | 7/2003 | Summerfelt et al. .......... 438/3 |
| 2004/0075126 A1 * | 4/2004 | Fujiwara et al. ............. 257/295 |
| 2006/0073613 A1 * | 4/2006 | Aggarwal et al. .............. 438/3 |
| 2007/0040198 A1 * | 2/2007 | Matsuura .................... 257/296 |
| 2007/0090438 A1 * | 4/2007 | Miura ........................ 257/303 |
| 2007/0228431 A1 * | 10/2007 | Wang ......................... 257/295 |

FOREIGN PATENT DOCUMENTS

JP 2000-277701 6/2000

* cited by examiner

*Primary Examiner*—Hsien-ming Lee
*Assistant Examiner*—Kevin A Parendo
(74) *Attorney, Agent, or Firm*—Harness, Dickey & Pierce, P.L.C.

(57) ABSTRACT

A method for manufacturing a semiconductor device, the method including the steps of: (a) forming a titanium layer above a substrate; (b) forming a barrier layer above the titanium layer; (c) changing the titanium layer to a titanium nitride layer by conducting a heat treatment in a nitrogen containing atmosphere; (d) forming a first electrode above the barrier layer; (e) forming a ferroelectric layer above the first electrode; and (f) forming a second electrode above the ferroelectric layer.

11 Claims, 9 Drawing Sheets

FIG. 15 ated in a nitrogen containing atmosphere to thereby change the titanium layer to a titanium nitride layer, such that, in a later step to be conducted (for example, in recovery anneal (i.e., a heat treatment in an oxygen atmosphere) to recover the characteristics of the ferroelectric layer), the titanium layer is oxidized, and a plug in an underlying layer can be prevented from being oxidized.

METHODS FOR FORMING SEMICONDUCTING DEVICE WITH TITANIUM NITRIDE ORIENTATION LAYER

The entire disclosure of Japanese Patent Application No. 2005-236258, filed Aug. 17, 2005 is expressly incorporated by reference herein.

BACKGROUND

1. Technical Field

The present invention relates to methods for manufacturing semiconductor devices that include a first electrode, a ferroelectric layer, and a second electrode.

2. Related Art

A ferroelectric memory device (FeRAM) is a nonvolatile memory that is capable of high-speed operation at low voltages, and its memory cell can be composed with one transistor and one capacitor (1T/1C). Accordingly, ferroelectric memory devices can be integrated to the level of integration of DRAMs, and therefore are highly expected as large-capacity nonvolatile memories.

In order to make a ferroelectric capacitor that composes a ferroelectric memory device to achieve its best ferroelectric characteristics, the crystal orientation of each of the layers that compose the ferroelectric capacitor is extremely important. In this connection, an example of related art is described in Japanese laid-open patent application JP-A-2000-277701.

SUMMARY

In accordance with an advantage of some aspects of the present invention, it is possible to provide a method for manufacturing a semiconductor device having a ferroelectric capacitor composed of multiple layers in which the crystal orientation of each of the layers composing the ferroelectric capacitor can be well controlled.

A method for manufacturing a semiconductor device in accordance with an embodiment of the invention includes the steps of: (a) forming a titanium layer above a substrate; (b) forming a barrier layer above the titanium layer; (c) changing the titanium layer to a titanium nitride layer by conducting a heat treatment in an atmosphere including nitrogen; (d) forming a first electrode above the barrier layer; (e) forming a ferroelectric layer above the first electrode; and (f) forming a second electrode above the ferroelectric layer.

According to the method for manufacturing a semiconductor device in accordance with the embodiment of the invention, a titanium layer is formed above a substrate, and a barrier layer is formed above the titanium layer. As a titanium layer excels in self-orientation property, by forming the barrier layer above the titanium layer, the crystal orientation property of the barrier layer can be dramatically improved, and the barrier layer having a crystal orientation that reflects the crystal orientation of the titanium layer can be formed. Also, by forming a first electrode above the barrier layer, the first electrode that reflects the crystal orientation of the barrier layer can be formed. Furthermore, by forming a ferroelectric layer above the first electrode, the ferroelectric layer that reflects the crystal orientation of the first electrode can be formed. As a result, the ferroelectric layer having a specified crystal orientation can be obtained, and therefore the semiconductor device with excellent hysteresis characteristics can be obtained.

Moreover, according to the method for manufacturing a semiconductor device in accordance with the embodiment of the invention, a heat treatment is conducted in a nitrogen Furthermore, according to the method for manufacturing a semiconductor device in accordance with the embodiment of the invention, as the barrier layer is formed with the crystal orientation property of the titanium layer being reflected therein, the barrier layer excels in oxygen barrier capability. For this reason, for example, a semiconductor device with excellent oxygen barrier capability can be obtained by forming a barrier layer with excellent crystal orientation property between the titanium nitride layer and the first electrode, compared to the case in which, after a first electrode is directly formed on a titanium layer, the titanium layer is changed to a titanium nitride layer.

In the method for manufacturing a semiconductor device in accordance with an aspect of the embodiment of the invention, the step (c) may be conducted before the step (d). This method makes it easier to change the titanium layer to a titanium nitride layer. Alternatively, the step (c) may be conducted after the step (d). By this method, the titanium layer can be changed to a titanium nitride layer and the crystal orientation property of the first electrode can also be improved by the heat treatment.

In the method for manufacturing a semiconductor device in accordance with an aspect of the embodiment of the invention, the titanium layer may be formed to a film thickness of 5 nm to 20 nm in the step (a).

In the method for manufacturing a semiconductor device in accordance with an aspect of the embodiment of the invention, the barrier layer may be a layer that includes titanium, aluminum and nitrogen, and the titanium nitride layer may be a TiN layer. As the titanium nitride layer has an oxygen barrier capability, the titanium nitride layer is suitable as an oxygen barrier layer. In this case, the composition of the barrier layer may be defined as $Ti_{(1-x)}Al_xN_y$ (where x is in a range of $0<x\leq30$ and y is greater than 0 ($0<y$)).

In the method for manufacturing a semiconductor device in accordance with an aspect of the embodiment of the invention, in the step (a), the titanium layer may be formed above a plug conductive layer including tungsten.

DESCRIPTION OF EXEMPLARY EMBODIMENTS

Preferred embodiments of the invention are described below with reference to the accompanying drawings.

1. Semiconductor Device

Figure 1:
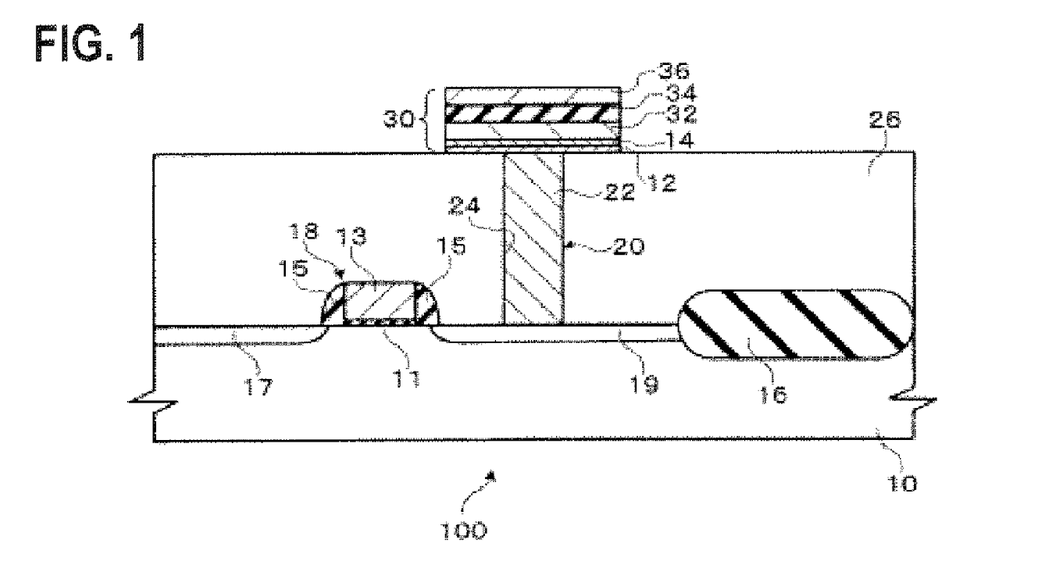
FIG. 1 schematically shows a cross-sectional view of a semiconductor device in accordance with an embodiment of the invention.

FIG. 1 schematically shows a cross-sectional view of a semiconductor device (e.g., a ferroelectric memory device) 100 in accordance with an embodiment of the invention As shown in FIG. 1, the semiconductor device 100 includes a ferroelectric capacitor 30, a plug 20, and a switching transistor 18 for the ferroelectric capacitor 30. It is noted that, although the present embodiment is described with reference to a 1T/1C type memory cell, the applicability of the invention is not limited to a 1T/1C type memory cell.

The transistor 18 includes a gate dielectric layer 11, a gate conductive layer 13 provided on the gate dielectric layer 11, and first and second impurity regions 17 and 19 that define source/drain regions. Also, a plug 20 is electrically connected to the switching transistor 18.

The ferroelectric capacitor 30 includes a titanium nitride layer 12, a barrier layer 14 provided above the titanium nitride layer 12, a first electrode 32 provided above the barrier layer 14, a ferroelectric film 34 provided above the first electrode 32, and a second electrode 36 provided above the ferroelectric film 34.

Also, the ferroelectric capacitor 30 is provided on the plug 20 that is provided in a dielectric layer 26. The plug 20 is formed on the second impurity region 19. The dielectric layer 26 has an opening section 24, and the plug 20 includes a plug conductive layer 22 provided in the opening section 24. The plug conductive layer 22 is composed of a high melting point metal, such as, tungsten, molybdenum, tantalum, titanium, nickel or the like, and may preferably be composed of tungsten.

The titanium nitride layer 12 has at least a portion provided on the plug 20. The titanium nitride layer 12 is crystalline, and may have a (111) orientation. The titanium nitride layer 12 can be obtained by nitriding a Ti layer. Also, this titanium nitride layer 12 can be composed of a TiN layer. A method for forming the titanium nitride layer 12 is described below. The titanium nitride layer 12 may preferably have a film thickness of about 5-20 nm.

The barrier layer 14 is provided above the titanium nitride layer 12. The barrier layer 14 may be composed of any one of appropriate materials having conductivity and oxygen barrier capability without any particular limitation, and may include crystalline, wherein the crystalline may preferably have a (111) orientation.

At the material of the barrier layer 14, for example, TiAlN, TiAl, TiSiN, TiN, TaN, and TaSiN may be enumerated. Above all, the barrier layer 14 may preferably be composed of a layer that includes titanium, aluminum and nitrogen (e.g., TiAlN).

When the barrier layer 14 is composed of TiAlN, and the composition (atom ratio) of titanium, aluminum and nitrogen in the barrier layer 14 is expressed by a chemical formula $Ti_{(1-x)}Al_xN_y$, in a preferred embodiment, x may be in a range of $0<x\leqq0.3$, and y may be greater than 0 ($0<y$).

The barrier layer 14 may preferably be grown to a film thickness of at least 20 nm in order to form, above the barrier layer 14, a first electrode 32 having a crystal orientation that reflects the crystal orientation of the barrier layer 14. For example, the barrier layer may preferably be grown to a film thickness of 100-200 nm.

When the barrier layer 14 is composed of crystalline, the barrier layer 14 may preferably have a (111) orientation. When the crystal orientation of the barrier layer 14 is in a (111) orientation, a first electrode 32 having a crystal orientation that reflects the crystal orientation of the barrier layer 14 can be formed above the barrier layer 14, such that the crystal orientation of the first electrode 32 can be made in a (111) orientation.

The first electrode 32 may be composed of at least one kind of metal selected from platinum, ruthenium, rhodium, palladium, osmium and iridium, may preferably be composed of platinum or iridium, and may more preferably be composed of iridium. Also, the first electrode 32 may be composed of a single layer film, or a multilayer film of laminated layers. When the first electrode 32 is crystalline, the crystal orientation of the first electrode 32 and the crystal orientation of the barrier layer 14 may preferably be in an epitaxial orientation relation at an interface between them. In this case, the crystal orientation of the ferroelectric layer 34 and the crystal orientation of the first electrode 32 may also preferably be in an epitaxial orientation relation at an interface between them.

For example, when the barrier layer 14 belongs to cubic crystal system, and its crystal orientation is in a (111) orientation, or the barrier layer 14 belongs to hexagonal crystal system, and its crystal orientation is in a (001) orientation, the crystal orientation of the first electrode 32 may preferably be in a (111) orientation. With this structure, when the ferroelectric layer 34 is formed on the first electrode 32, the crystal orientation of the ferroelectric layer 34 can be readily made in a (111) orientation.

The ferroelectric film 34 includes a ferroelectric material. The ferroelectric material has a perovskite crystal structure and may be expressed by a general formula of $A_{1-b}B_{1-a}X_aO_3$. The element A includes Pb. A part of Pb may be replaced with La. The element B is composed of at least one of Zr and Ti. The element X may be composed of at least one of V, Nb, Ta, Cr, Mo, W, Ca, Sr and Mg. As a ferroelectric material included in the ferroelectric film 34, a known material that can be used as a ferroelectric film, such as, for example, (Pb(Zr, Ti)O$_3$) (PZT), SrBi$_2$Ta$_2$O$_9$ (SBT), and (Bi, La)$_4$Ti$_3$O$_{12}$ (BLT) can be enumerated.

Among the materials listed above, PZT is suitable as the material of the ferroelectric film 34. In this case, the first electrode 32 may preferably be composed of iridium from the viewpoint of the device reliability.

When PZT is used as the material of the ferroelectric film 34, the content of titanium in the PZT may preferably be greater than the content of zirconium in order to obtain a greater amount of spontaneous polarization. The PZT with such a composition belongs to tetragonal crystal, and its spontaneous polarization axis is c-axis. However, in this case, because an a-axis orientation component that is orthogonal to c-axis concurrently exists therein, and the a-axis orientation component does not contribute to polarization reversal when the PZT is c-axis oriented, there is a possibility that its ferroelectric characteristics may be damaged. In contrast, by making the crystal orientation of PZT used in the ferroelectric film 34 in a (111) orientation, the a-axis can be oriented in a direction that is shifted off at a predetermined angle from the normal line of the substrate. In other words, the polarization axis has a component in a direction normal to the substrate, and therefore can contribute to polarization reversal. Accordingly, when the ferroelectric film 34 is composed of PZT, and the content of titanium in the PZT is greater than the content of zirconium therein, the crystal orientation of the PZT is preferably be in a (111) orientation, in view of the fact that the hysteresis characteristic of the PZT is excellent.

The second electrode 36 may be composed of any of the materials described above as an example of the material that can be used as the first electrode 32, or may be composed of aluminum, silver, nickel or the like. Also, the second electrode 36 may be in a single layer film, or a multilayer film of laminated layers. The second electrode 36 may preferably be composed of platinum or a laminated film of layers of iridium oxide and iridium.

In the ferroelectric capacitor 30 in accordance with the embodiment of the invention, the first electrode 32 is provided above the plug 20 through the titanium nitride layer 12 and the barrier layer 14, such that the first electrode 32 and the ferroelectric layer 34 that do not reflect the crystal structure of an underlying layer (e.g., the plug 20) can be provided. In other words, although the ferroelectric capacitor 30 in accordance with the embodiment of the invention is provided above the plug 20, the crystal structure of an underlying layer (the plug 20) is not reflected in the first electrode 32 and the ferroelectric layer 34.

Let us assume a case in which the first electrode 32 of the ferroelectric capacitor 30 is directly disposed on the plug conductive layer 22 of the plug 20. In this case, when the plug conductive layer 22 is composed of a material having a high degree of crystallinity, the crystal orientation of the plug conductive layer 22 might affect the crystal orientation of the first electrode 32. For example, when the plug conductive layer 22 of the plug 20 is composed of tungsten, and if the first electrode 32 is directly provided on the plug conductive layer 22 composed of tungsten, because tungsten has a high degree of crystallinity, the crystalline structure of the plug conductive layer 22 affects the crystalline structure of the first electrode 32, which makes it difficult to provide the first electrode 32 with a desired crystal structure. Furthermore, because the ferroelectric layer 34 is provided on the first electrode 32 in this case, the crystal orientation of the first electrode 32 might affect the crystal orientation of the ferroelectric film 34. In this case, because the crystal orientation of the ferroelectric film 34 reflects the crystal orientation of the first electrode 32, polarization in an undesired orientation may be generated, and the hysteresis characteristics of the ferroelectric capacitor 30 may be deteriorated.

In contrast, according to the ferroelectric capacitor 30 in accordance with the embodiment of the invention, the first electrode 32 is provided over the plug 20 through the titanium nitride layer 12 and the barrier layer 14, such that the crystal orientation of the plug conductive layer 22 of the plug 20 can be prevented from being reflected in the crystal orientation of the first electrode 32 and the ferroelectric film 34. As a result, the ferroelectric capacitor 30 with excellent hysteresis characteristic can be obtained.

When the cross-sectional area of the plug 20 is constant, it is noted that the smaller the plane area of the ferroelectric capacitor 30, the smaller the rate of the plane area of the ferroelectric capacitor 30 to the cross-sectional area of the plug 20 becomes, and the problem concerning crystal orientation, which originates from the crystal orientation of the plug conductive layer 22 and impacts the first electrode 32 and the ferroelectric film 34, becomes more serious. In contrast, the ferroelectric capacitor 30 in accordance with the embodiment of the invention is useful, because the structure of the ferroelectric capacitor 30 can prevent deterioration of the hysteresis characteristics for the reasons described above, even when the ferroelectric capacitor 30 is miniaturized.

Also, according to the ferroelectric capacitor 30 in accordance with the embodiment of the invention, the first electrode 32 is provided above the crystalline barrier layer 14. By this, the crystal orientation property of the first electrode 32 that is provided over the barrier layer 14 can be increased. As a result, the ferroelectric layer 34 with excellent crystal orientation property can be provided on the first electrode 32, such that the ferroelectric capacitor 30 excels in hysteresis characteristics.

In particular, as described above, when the ferroelectric film 34 is composed of PZT, and the content of titanium in the PZT is greater than the content of zirconium, the crystal orientation of the PZT may preferably be in a (111) orientation, in view of the fact that the PZT has favorable hysteresis characteristics. According to the ferroelectric capacitor 30 in accordance with the embodiment of the invention, because the barrier layer 14 whose crystal orientation is in a (111) orientation is provided, the crystal orientation of the first electrode 32 and the ferroelectric layer 34 can be readily made in a (111) orientation. Because of the reasons described above, the ferroelectric capacitor 30 in accordance with the embodiment of the invention has excellent hysteresis characteristics.

2. Method For Manufacturing Semiconductor Device 2.1. First Embodiment

Next, a method for manufacturing a semiconductor device 100 shown in FIG. 1 is described with reference to the accompanying drawings. FIGS. 2A through 2F are cross-sectional views schematically showing steps of a process for manufacturing the semiconductor device 100 shown in FIG. 1. It is noted that FIGS. 2A through 2F show only an area adjacent to a dielectric layer 26 and a plug 20 in the semiconductor device 100 shown in FIG. 1.

The method for manufacturing the semiconductor device 100 in accordance with the embodiment of the invention includes the steps of (a) forming a titanium layer 112a above a substrate 10; (b) forming a barrier layer 14a above the titanium layer 112a; (c) changing the titanium layer 112a to a titanium nitride layer 12a by conducting a heat treatment in a nitrogen containing atmosphere; (d) forming a first electrode 32a above the barrier layer 14a; (e) forming a ferroelectric layer 34a above the first electrode 32a; and (f) forming a second electrode 36a above the ferroelectric layer 34a.

First, a transistor 18 and a plug 20 are formed (see FIG. 1). More concretely, the transistor 18 is formed on a semiconductor substrate 10, and then a dielectric layer 26 is laminated over the transistor 18. Next, an opening section 24 is formed in the dielectric layer 26 by, for example, a dry etching method, and the opening section 24 is embedded with a plug conductive layer 22, thereby forming the plug 20. The plug conductive layer 22 may be embedded by, for example, a CVD method or a sputter method, and the plug conductive layer 22 deposited on the upper surface of the dielectric layer 26 is removed by, for example, mechanical chemical polishing, whereby the plug 20 is formed.

Next, a ferroelectric capacitor 30 is formed (see FIG. 2A-FIG. 2F).

Figure 2A:
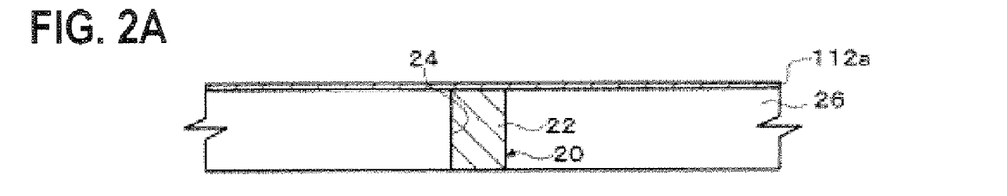
FIGS. 2A-2F are cross-sectional views schematically showing steps of a method for manufacturing a semiconductor device shown in FIG. 1.

First, as shown in FIG. 7A, a titanium layer 112a is formed above the substrate 10 (more concretely, on the dielectric layer 26 and the plug 20). The titanium layer 112a may be formed by any one of suitable film forming methods, such as, for example, a sputter method and a CV) method. A titanium layer generally has a high degree of self-orientation property, and forms a layer of hexagonal close-packed structure with a (001) orientation, when formed by a sputter method or a CVD method. Therefore, the titanium layer 112a has a hexagonal close-packed structure with a (001) orientation.

In order to make a barrier layer 14a, which is to be formed on the titanium layer 112a in a later step to be described below, to have a (111) orientation, the titanium layer 112a may preferably have a film thickness of 5-20 nm. When the film thickness of the titanium layer 112a is less than a nm, it becomes difficult to control the barrier layer 14a to have a (111) orientation. On the other hand, when the film thickness of the titanium layer 112a exceeds 20 nm, nitridation of the titanium layer 112a would become difficult to advance in a later step to be described below.

Figure 2B:
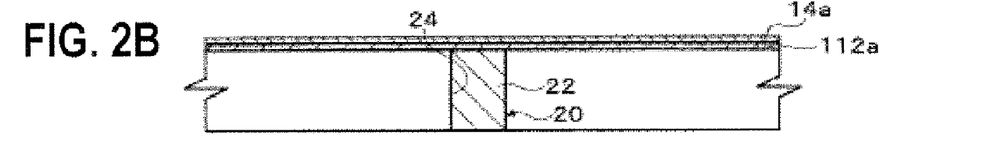

Next, as shown in FIG. 2B, a barrier layer 14a is formed on the titanium layer 112a. By this, the barrier layer 14a with a (111) orientation, which reflects the (001) orientation of the titanium layer 112a, can be formed. In other words, the lattice structure of the titanium layer 112a and the lattice structure of the barrier layer 14a match each other at the interface between the titanium layer 112a and the barrier layer 14a, such the barrier layer 14a is formed on the titanium layer 112a in a manner of epitaxial growth.

The barrier layer 14a may be formed by any one of suitable film forming methods according to the material used therein, and may be formed by, for example, a sputter method or a CVD method. As described above, the barrier layer 14a may preferably be crystalline, and more preferably, have a (111) orientation.

For example, when the barrier layer 14a is composed of a layer containing titanium, aluminum and nitrogen, the barrier layer 14a may be composed of TiAlN with a (111) orientation. When the barrier layer 14a has a (111) orientation, the crystal orientation of the first electrode 32 can be oriented to a (111) orientation. By this, a ferroelectric layer 34 that is to be formed on a first electrode 32 can be oriented to a (111) orientation.

As described above, when the ferroelectric film 34 is composed of PZT, and the content of titanium in the PZT is greater than the content of zirconium, the crystal orientation of the PZT may preferably be in a (111) orientation, in view of the fact that the PZT has favorable hysteresis characteristics. Accordingly, by making the crystal orientation of the barrier layer 14a in a (111) orientation, the first electrode 32a and the ferroelectric layer 34a can both be oriented to a (111) orientation, such that the ferroelectric capacitor 30 with excellent hysteresis characteristics can be obtained.

It is noted that the substrate temperature at which the barrier layer 14a is grown may appropriately be selected, for example, between room temperature and 500° C. without any particular limitation.

Figure 2C:
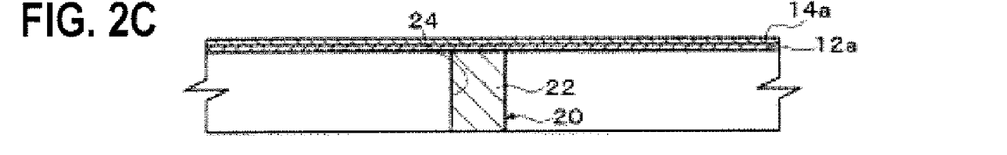

Next, as shown in FIG. 2C, a heat treatment is conducted in a nitrogen containing atmosphere, whereby the titanium layer 112a is changed to a titanium nitride layer (a TiN layer) 12a. The nitrogen containing atmosphere is not particularly limited to a specific ratio, as long as the atmosphere can nitride the titanium layer 112a. Also the temperature of the heat treatment is not particularly limited to a specific range as long as the titanium layer 112a can be nitrided, and may preferably be in a range between 500° C. and 650° C. When the temperature of the heat treatment exceeds 650° C., the characteristics of the transistor 18 may be affected. On the other hand, when the temperature of the heat treatment is less than 500° C., it takes too long to nitride the titanium layer 112a, which is not desirable.

It is noted that another kind of atmosphere (for examples $NH_3$ or the like) instead of a nitrogen containing atmosphere may also be used as long as the titanium layer 112a can be changed to the titanium nitride layer 12a by the atmosphere. Also, the method of heat treatment is not particularly limited, and for example, the heat treatment may be conducted by lamp anneal.

The obtained titanium nitride layer 12a excels in oxidation resistance in recovery anneal (i.e., heat treatment in an oxygen atmosphere) to be applied to a ferroelectric layer 34, which is to be conducted after forming a ferroelectric capacitor 30.

Figure 2D:
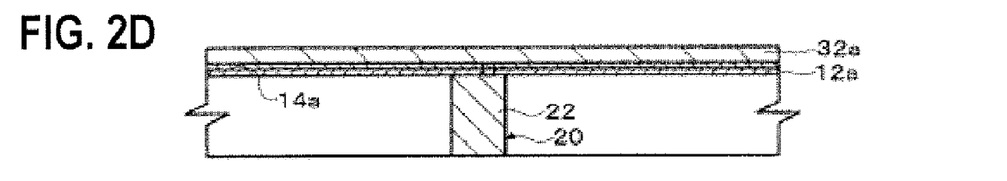

Then, as shown in FIG. 2D, a first electrode 32a is formed on the barrier layer 14a. It is noted that, by forming the first electrode 32a that is crystalline on the barrier layer 14a, the crystallinity of the first electrode 32a is considerably improved, and the crystal orientation of the barrier layer 14a can be reflected in the first electrode 32a. For example, when the crystal orientation of the barrier layer 14a is in a (111) orientation, the first electrode 32a can be formed with a (111) orientation.

The first electrode 32a may be formed by any one of suitable film forming methods to be selected according to the material of the first electrode 32a, and may be formed by, for example, a sputter method or a CVD method.

Figure 2E:
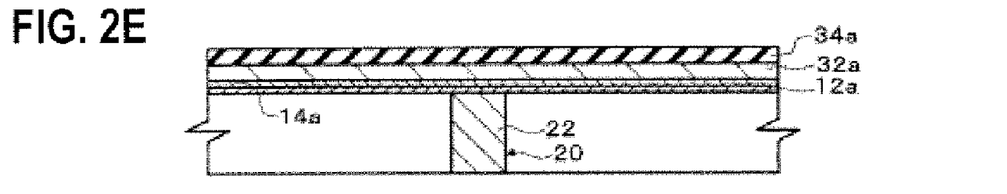

Next, as shown in FIG. 2E, a ferroelectric layer 34a is formed on the first electrode 32a. It is noted that, by forming the ferroelectric layer 34a on the first electrode 32a, the crystal orientation of the first electrode 32a can be reflected in the ferroelectric layer 34a. For example, when at least a portion of the first electrode 32a is crystalline with a (111) orientation, the crystal orientation of the barrier layer 14a can be formed with a (111) orientation.

The ferroelectric layer 34a may be formed by any one of suitable film forming methods to be selected according to the material of the ferroelectric layer 34a, and may be formed by, for example, a spin-on method, a sputter method, or a MOCVD method.

Figure 2F:
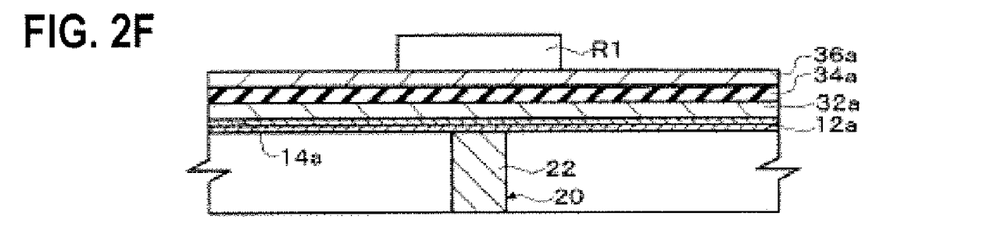

Next, as shown in FIG. 2F, a second electrode 36a is formed on the ferroelectric layer 34a. The second electrode 36a may be formed by any one of suitable film forming methods to be selected according to the material of the second electrode 36a, and may be formed by, for example, a sputter method or a CVD method. Then, a resist layer R1 having a specified pattern is formed on the second electrode 36a, and the laminated layers are patterned by a photolithography method, using the resist layer R1 as a mask. By this, a semiconductor device 100 that includes a stacked type ferroelectric capacitor 30 can be obtained (see FIG. 1). The ferroelectric capacitor 30 included in the semiconductor device 100 has a first electrode 32 provided on the barrier layer 14, a ferroelectric layer 34 provided on the first electrode 32, and a second electrode 36 provided on the ferroelectric layer 34.

According to the method for manufacturing a semiconductor device 100 in accordance with the present embodiment described above, the following actions and effects can be obtained.

First, by forming a titanium layer 112a above a substrate 10, forming a barrier layer 14a above the titanium layer 112a, and then applying a heat treatment to the formed layers in a nitrogen containing atmosphere, the titanium layer 112a can be changed to a titanium nitride layer 12a. In other words, by forming the titanium layer 112a with excellent self orientation property, and then forming the barrier layer 14a on the titanium layer 112a, the crystal orientation property of the barrier layer 14a can be substantially improved, and the barrier layer 14a having a crystal orientation that reflects the crystal orientation of the titanium layer 112a can be formed. Then, by forming the first electrode 32a and the ferroelectric layer 34a on the barrier layer 14a, the first electrode 32a and the ferroelectric layer 34a having a crystal orientation that reflects the crystal orientation of the barrier layer 14a can be obtained. As a result, the semiconductor device 100 with excellent hysteresis characteristics can be obtained.

In particular, because the barrier layer 14 whose crystal orientation is in a (111) orientation is provided, the crystal orientation of the first electrode 32 and the ferroelectric layer 34 can be readily directed in a (111) orientation. By this, the ferroelectric capacitor 30 with particularly excellent hysteresis characteristics can be formed.

Secondly, because the barrier layer 14 is formed, reflecting the crystal orientation property of the titanium layer 112a, like an epitaxial layer, the barrier layer 14a excels in oxygen barrier capability. For this reason, for example, the ferroelectric capacitor 30 with more excellent oxidation barrier capability can be obtained through forming the barrier layer 14 with excellent crystal orientation property between the titanium nitride layer 12 and the first electrode 32 in accordance with the present embodiment, compared to the case in which, after a first electrode 32a is directly formed on a titanium layer 112a, the titanium layer 112a is nitrided to form a titanium nitride layer.

Thirdly, as described in the foregoing paragraph "1. Semiconductor Device," in accordance with the present embodiment, the first electrode 32 and the ferroelectric layer 34 with a predetermined crystal orientation, which do not reflect the crystalline structure of the lower layer (the plug 20), can be formed, such that the ferroelectric capacitor 30 with excellent hysteresis characteristics can be obtained.

Fourthly, in accordance with the present embodiment, because a heat treatment is conducted in a nitrogen containing atmosphere whereby the titanium layer 112a is changed to the titanium nitride layer 12a, the plug 20 in a lower layer can be prevented from being oxidized, as a result of oxidation of the titanium layer 112a, in a later step to be conducted (for example, in recovery anneal (i.e., heat treatment in an oxygen atmosphere) to recover the characteristics of the ferroelectric layer 34). For this reason, a loss in the electrical characteristics of the ferroelectric capacitor 30 can be prevented.

2.2. Second Embodiment

Next, a method for manufacturing a semiconductor device 100 shown in FIG. 1 in accordance with a second example of the embodiment is described with reference to the accompanying drawings. FIGS. 3A through 3F are cross-sectional views schematically showing steps of a process for manufacturing the semiconductor device 100 shown in FIG. 1. It is noted that FIGS. 3A through 3F show only an area adjacent to a dielectric layer 26 and a plug 20 in the semiconductor device 100 shown in FIG. 1.

Figure 3A:
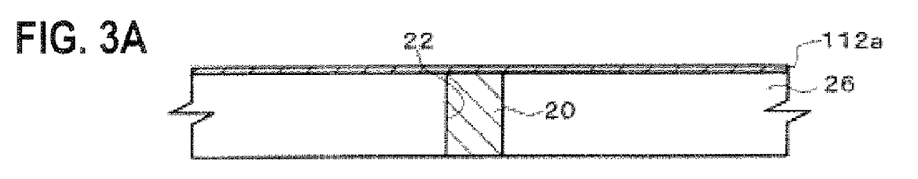
FIGS. 3A-3F are cross-sectional views schematically showing steps of a method for manufacturing a semiconductor device shown in FIG. 1.
Figure 3B:
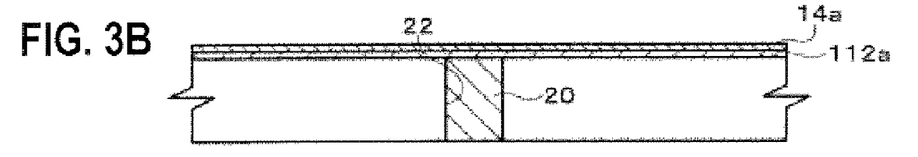
Figure 3C:
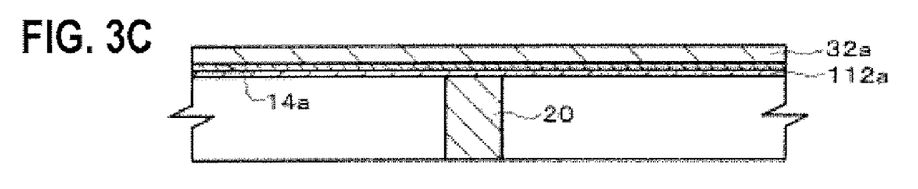
Figure 3D:
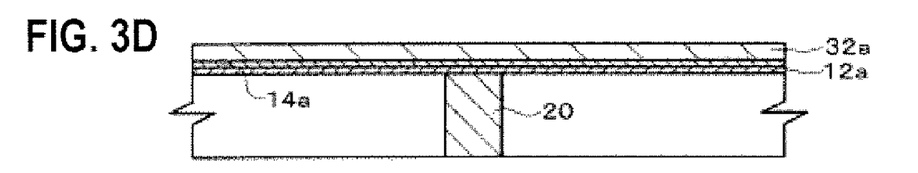
Figure 3E:
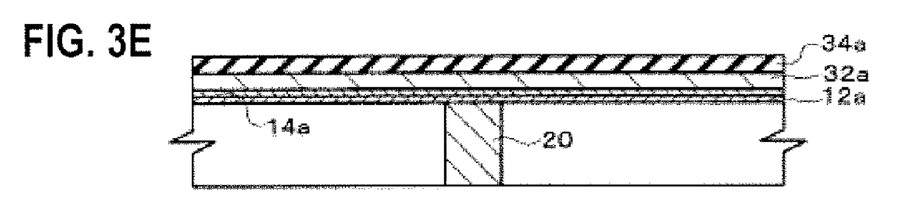
Figure 3F:
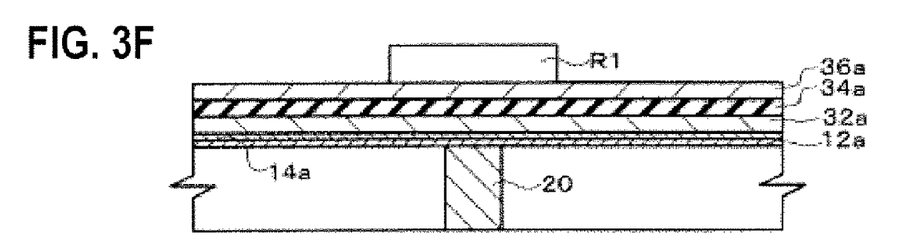

The second example of the embodiment is generally the same as the method for manufacturing a semiconductor device in accordance with the first embodiment described above except that, after a first electrode 32a is formed, a titanium layer 112a is changed to a titanium nitride layer 12a (see FIG. 3C). In other words, FIG. 3A, FIG. 3B and FIG. 3D-FIG. 3F correspond to FIG. 2A, FIG. 2B, and FIG. 2D-FIG. 2F, respectively. For this reason, in the second example of the embodiment, detailed descriptions of sections of the present exemplary embodiment similar to those of the first embodiment are omitted. A semiconductor device 100 shown in FIG. 1 can also be manufactured by the manufacturing method in accordance with the second example of the embodiment.

The method for manufacturing a semiconductor device 100 in accordance with the second example of the embodiment provides actions and effects similar to those of the method for manufacturing a semiconductor device 100 in accordance with the first embodiment. In addition, in the method for manufacturing a semiconductor device 100 in accordance with the present exemplary embodiment, a titanium layer 112a, a barrier layer 14a and a first electrode 32a are sequentially formed (see FIG. 3A and FIG. 3B), and then a heat treatment is conducted in a nitrogen containing atmosphere to thereby change the titanium layer 112a to a titanium nitride layer 12a (see FIG. 3C). According to this process, by conducting a heat treatment in a nitrogen containing atmosphere, the titanium layer 11a is changed to the titanium nitride layer 12a, and the crystal orientation property of the first electrode 32a can be improved as well.

3. Embodiment Examples

The invention is described below in greater detail based on embodiment examples, but it should be noted that the invention is not limited to those embodiment examples.

3.1. Embodiment Example 1

In the present embodiment example, a semiconductor device 100 was manufactured according to the process shown in FIG. 1 and FIG. 2A FIG. 2F.

First, a transistor 18 was formed on a semiconductor substrate (silicon substrate) 10, and then a dielectric layer 26 was deposited on the transistor 18. Next, an opening section 24 was formed in the dielectric layer 26 by a dry etching method, the opening section 24 is filled with tungsten by a CVD method, and portions of tungsten present above the dielectric layer 26 and the opening section 24 were removed by chemical mechanical polishing, whereby a plug conductive layer 22 was formed. By the steps described above, a plug 20 was formed (see FIG. 1).

Next, a titanium layer 112a having a film thickness of 20 nm was formed on the dielectric layer 26 and the plug 20 by a sputter method, using titanium as a target (see FIG. 2A). The titanium layer 112a was formed under a film forming condition in which the flow amount of atmosphere (argon gas) was 50 [sccm], the film forming power was 1.5 [kW], and the substrate temperature was 150 [° C.].

Figure 4:
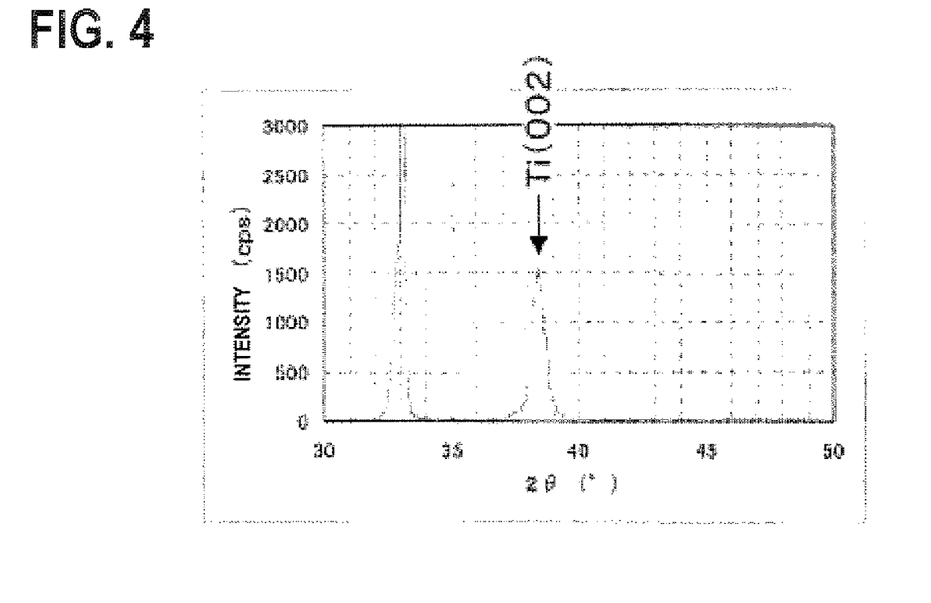
FIG. 4 shows an XRD pattern of a titanium barrier layer formed in Embodiment Example 1.

An XRD (X-ray diffraction) pattern of the obtained titanium layer 112a is shown in FIG. 4. According to FIG. 4, only a diffraction peak near $2\theta=38.5°$ is observed. The diffraction peak is assumed to be a (002) peak that originates from crystalline titanium having a (001) orientation (c-axis orientation). According to the foregoing result, it was confirmed that a crystalline titanium layer 112a having a (001) orientation (c-axis orientation) was formed, and the titanium layer 112a was a c-axis single orientation film.

It is noted that, in FIGS. 4-6, FIGS. 9-11, FIG. 14 and FIG. 15, peaks observed near 2θ=33° are assumed to be originated from Si of the substrate 10.

Then, a barrier layer 14a having a film thickness of 100 nm was formed on the titanium layer 112a by a sputter method, using titanium and aluminum as a target, in a nitrogen containing atmosphere (see FIG. 2B). The barrier layer 14a was formed under a film forming condition in which the flow amount of atmosphere (mixed gas of argon and nitrogen) was 50 [sccm], the nitrogen partial pressure in the atmosphere was 16[%], the film forming power was 1.0 [kW], and the substrate temperature was 400 [° C.].

Figure 5:
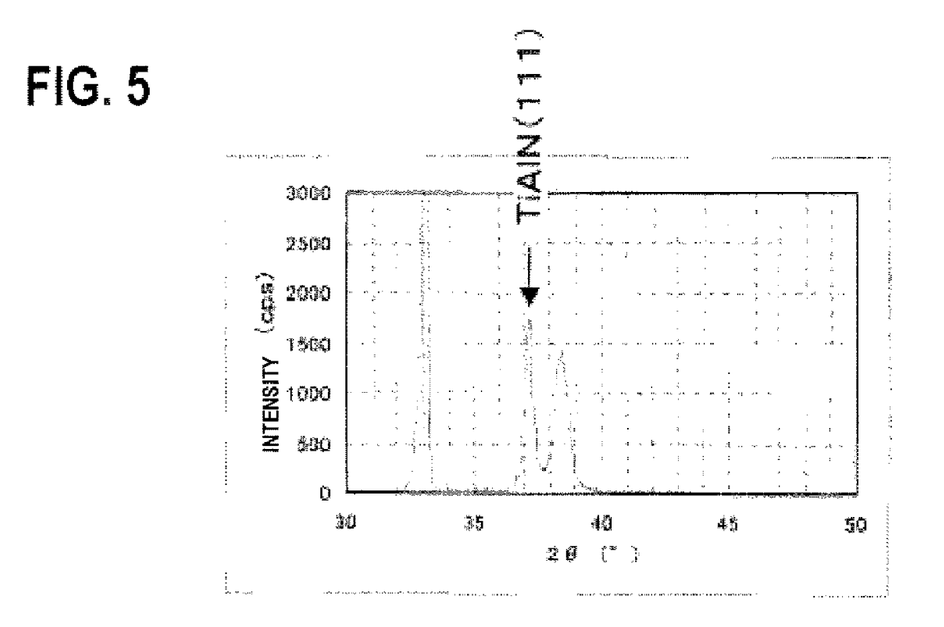
FIG. 5 shows an XRD pattern of a TiAlN layer formed in Embodiment Example 1.

An XRD (X-ray diffraction) pattern of the obtained barrier layer 14a is shown in FIG. 5. According to FIG. 5, a new diffraction peak near 2θ=37° is observed. The new diffraction peak is assumed to originate from crystalline TiAlN having a (111) orientation. According to the foregoing result, it was confirmed that the barrier layer 14a composed of crystalline TiAlN with a (111) orientation, which reflects the crystal orientation ((001) orientation) of the titanium layer 112a in a lower layer, was formed.

Then, a heat treatment (lamp anneal) was conducted in a nitrogen atmosphere whereby the titanium layer 112a was changed to a titanium nitride layer (TiN layer) 12a (see FIG. 2C). It is noted that the heat treatment was conducted at 650[° C.], and the heat treatment time duration was 2 minutes.

Figure 6:
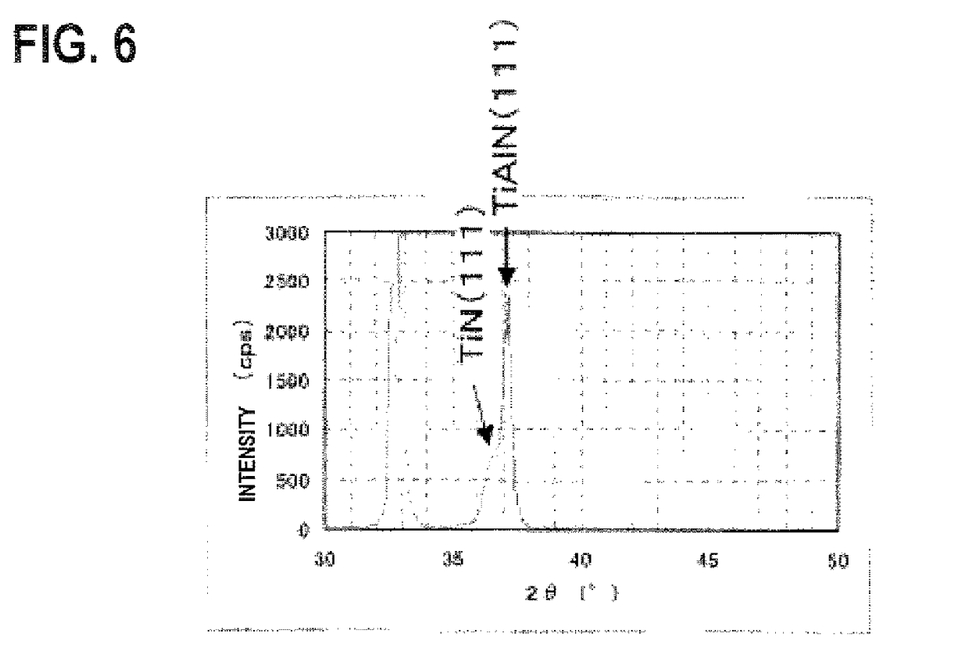
FIG. 6 shows an XRD pattern of a layer that has been heat treated in a nitrogen atmosphere in Embodiment Example 1.

An XRD (X-ray diffraction) pattern of the obtained titanium nitride layer 12a is shown in FIG. 6. According to FIG. 6, the peak existed near 2θ=38.5° that originates from titanium disappeared, and a new diffraction peak near 2θ=36.5° (see FIG. 4) is observed. It is assumed that the new diffraction peak originates from crystalline TiN having a (111) orientation. According to the foregoing result, it was confirmed that the titanium layer 112a was nitrided by the heat treatment in a nitrogen atmosphere whereby the crystalline titanium nitride layer 12a with a (111) orientation was formed.

Next, a first electrode 32a having a film thickness of 100 nm was formed on the barrier layer 14a by a sputter method, using iridium as a target (see FIG. 2D). The first electrode 32a was formed under a film forming condition in which the flow amount of atmosphere (argon gas) was 199 [sccm], the film forming power was 1.0 [kW], and the substrate temperature was 500[° C.].

Figure 7:
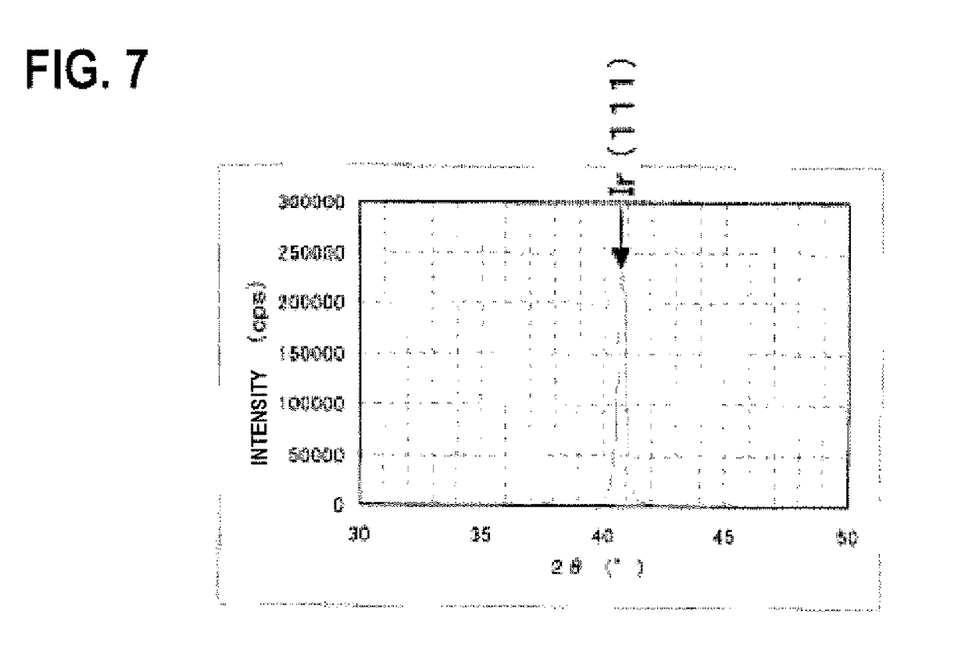
FIG. 7 shows an XRD pattern of a first electrode (Ir layer) formed in Embodiment Example 1.

An XRD (X-ray diffraction) pattern of the obtained first electrode 32a is shown in FIG. 7. According to FIG. 7, a new peak is observed near 2θ=41°. It is assumed that the new peak originates from crystalline Ir having a (111) orientation. Besides this peak, no peak originating from Ir is observed. According to the foregoing result, it was confirmed that the first electrode 32a composed of crystalline Ir with a (111) orientation was formed, and the first electrode 32a was composed of a single orientation film.

Figure 8:
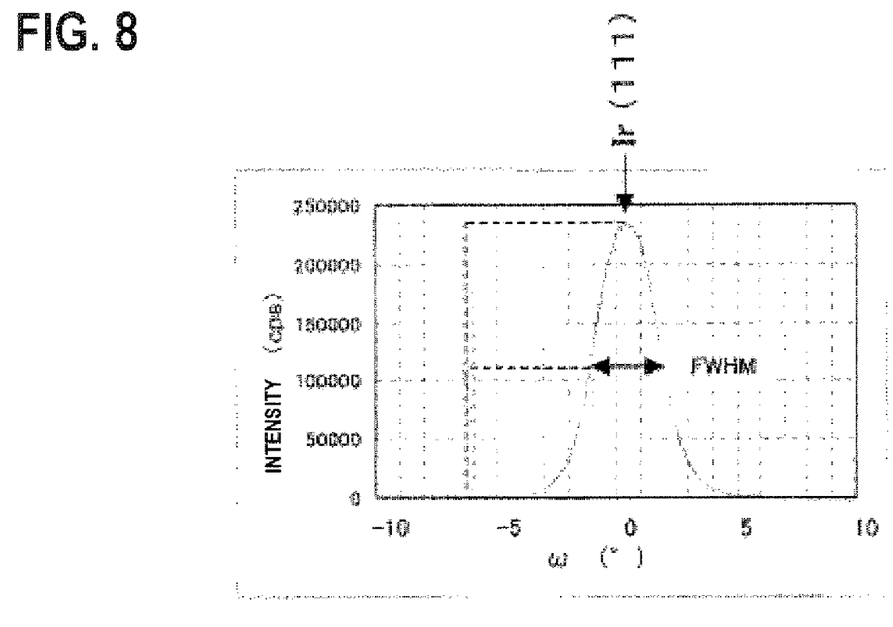
FIG. 8 shows a rocking curve of a diffraction peak in a (111) orientation indicated in FIG. 7.

In order to quantitatively evaluate the crystal orientation property of the first electrode 32a, a rocking curve of the diffraction peak with a (111) orientation shown in FIG. 7 was measured. The result is shown in FIG. 8. The full width at half maximum (FWHM) of the rocking curve shown in FIG. 8 was about 2.70°. It is noted that the full width at half maximum (FWHM) of a rocking curve is defined by a difference between two angles having a peak intensity that is half the maximum peak intensity, as shown in FIG. 8. From the foregoing result, it was confirmed that the first electrode 32a had an excellent (111) orientation property, as shown in FIG. 8.

Then, a ferroelectric layer 34a composed of PZT having a film thickness of 100 nm was formed on the first electrode 32a by a MOCVD method (see FIG. 2E).

Figure 9:
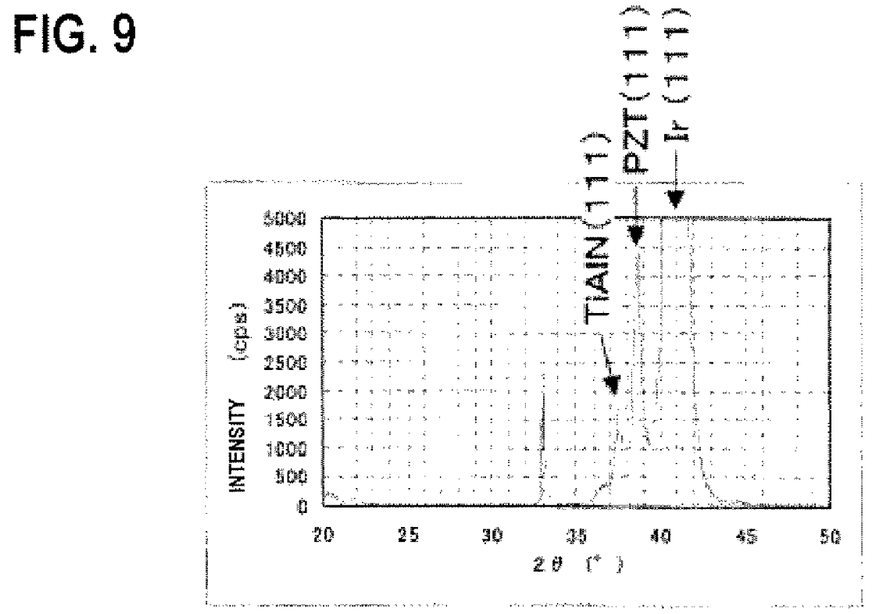
FIG. 9 shows an XRD pattern of a ferroelectric layer (PZT layer) formed in Embodiment Example 1.

An XRD (X-ray diffraction) pattern of the obtained ferroelectric layer 34a is shown in FIG. 9. According to FIG. 9, it was confirmed that, as the strongest diffraction peak of PZT was a (111) orientation, PZT was preferentially oriented to a (111) orientation. Next, in order to quantitatively evaluate the crystal orientation property of the ferroelectric layer 34a, the orientation rate of the ferroelectric layer 34a was investigated. The orientation rate is defined as follows.

When 1 (hkl)=(hkl) ... integrated intensity of a diffraction peak, and P (hkl)=(hkl) diffraction intensity obtained in powder pattern, the orientation rate ρ is expressed as ρ={I(111)/P(111)}/{I(100)/P(100)+I(101)/P(101)+I(111)/P(111)}.

According to the above formula and FIG. 9, the orientation rate of the ferroelectric film 34a in accordance with the present embodiment example was 99%.

Next, a second electrode 36a was formed, and then patterning was conducted, whereby a ferroelectric capacitor 30 was formed (see FIG. 2F and FIG. 1). A heat treatment was conducted in an oxygen atmosphere at 550° C. as recovery anneal for the ferroelectric capacitor 30. As a result, the titanium nitride layer 12 formed on the plug conductive layer 22 composed of tungsten could maintain desired capacitor characteristics without being oxidized.

3.2. Embodiment Example 2

In the present embodiment example, a semiconductor device 100 was manufactured under conditions similar to those of the manufacturing method of Embodiment Example 1 described above (see FIG. 3C), except that, after a first electrode 32a was formed, a heat treatment was conducted in a nitrogen atmosphere, whereby a titanium layer 112a was changed to a titanium nitride layer 12a. It is noted that the heat treatment in a nitrogen atmosphere was conducted in a manner similar to the manufacturing method of Embodiment Example 1 described above.

Figure 10:
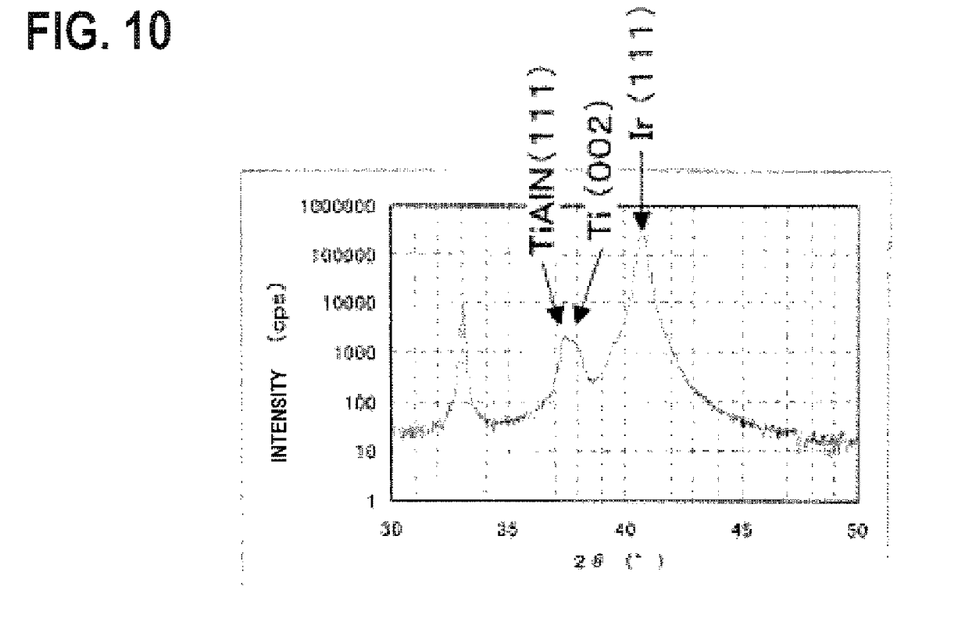
FIG. 10 shows an XRD pattern of a multilayered body composed of a Ti layer, a TiAlN layer and an Ir layer (first electrode) formed in Embodiment Example 2, before the multilayered body is heat treated in a nitrogen atmosphere.
Figure 11:
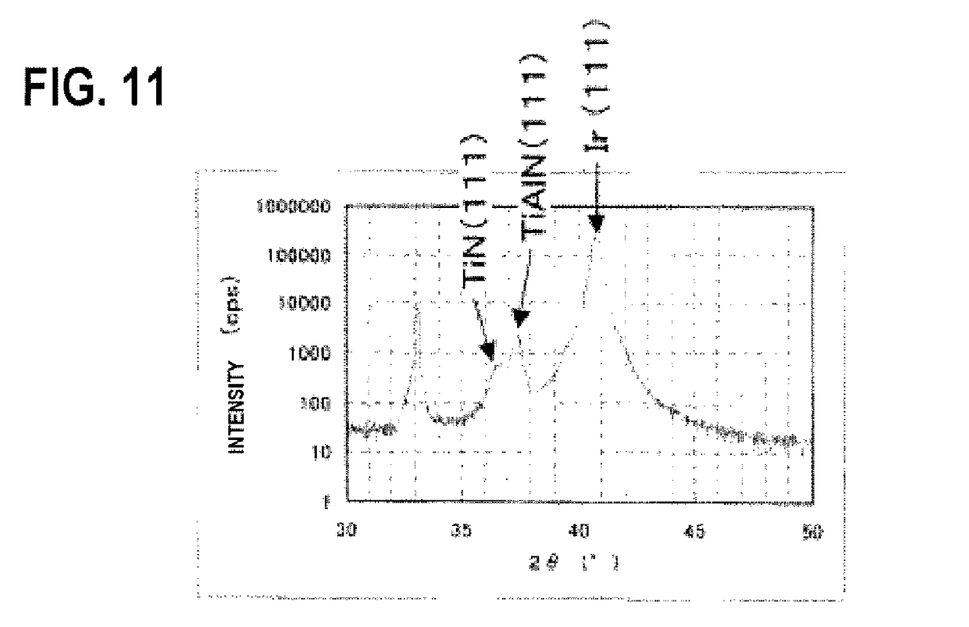
FIG. 11 shows an XRD pattern of the multilayered body of FIG. 10 after the multilayered body is heat treated in a nitrogen atmosphere.

FIG. 10 shows an XRD pattern of a laminated body of a titanium layer 112a, a barrier layer 14a composed of TiAlN and a first electrode 32a composed of Ir formed in accordance with the present embodiment example, before a heat treatment in a nitrogen atmosphere was conducted. Also, FIG. 11 shows an XRD pattern of the laminated body after a heat treatment was applied to the laminated body in a nitrogen atmosphere. Comparing FIG. 10 and FIG. 11, it was confirmed that a peak (near 2θ=37° shown in FIG. 10) existed before conducting the heat treatment in a nitrogen atmosphere disappeared after the heat treatment in a nitrogen atmosphere was conducted (see FIG. 11), and a new peak (near 2θ=36.5° shown in FIG. 11) was generated. It is assumed that the disappeared peak originates from titanium with a (002) orientation, and the peak newly confirmed originates from TiN with a (111) orientation.

From the foregoing result, it was also confirmed that the titanium layer 112a could be changed to the titanium nitride layer 12a even when a heat treatment in a nitrogen atmosphere was conducted after the first electrode 32a was formed.

3.3. Comparison Example 1

In accordance with a comparison example (Comparison Example 1), a semiconductor device 200 was manufactured under conditions similar to those of the manufacturing method of Embodiment Example 1 described above, except that a barrier layer 114 was formed on a dielectric layer 26 and a plug layer 20 without forming a titanium layer 112 (see FIGS. 13A-13D).

Figure 12:
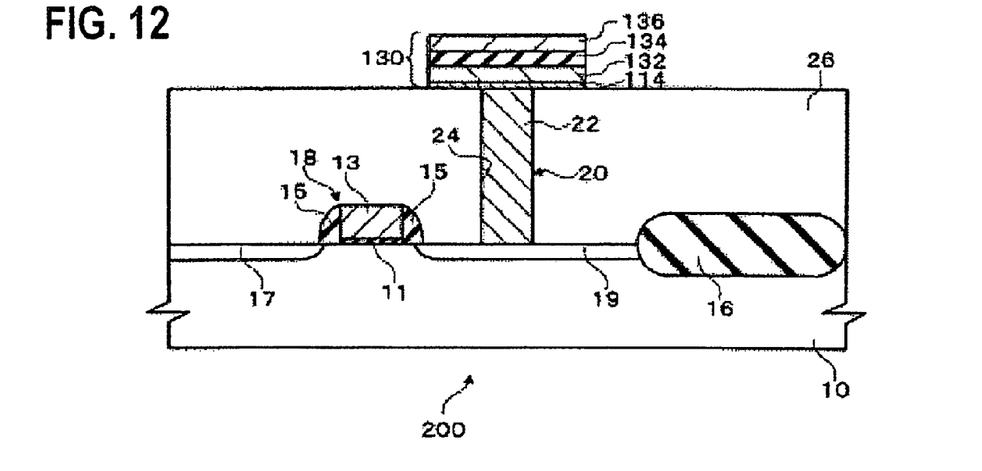
FIG. 12 is a cross-sectional view schematically showing a semiconductor device in accordance with Comparison Example 1.
Figure 13A:
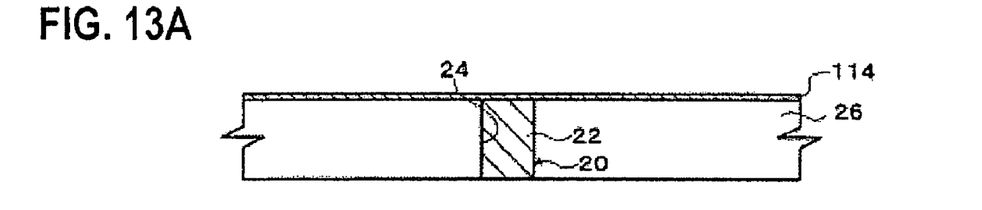
FIGS. 13A-13D are cross-sectional views schematically showing steps of a method for manufacturing a semiconductor device in accordance with Comparison Example 1.
Figure 13B:
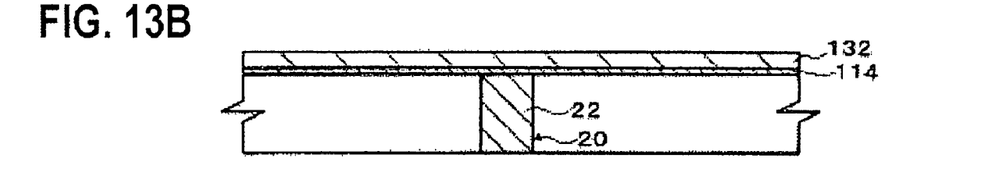
Figure 13C:
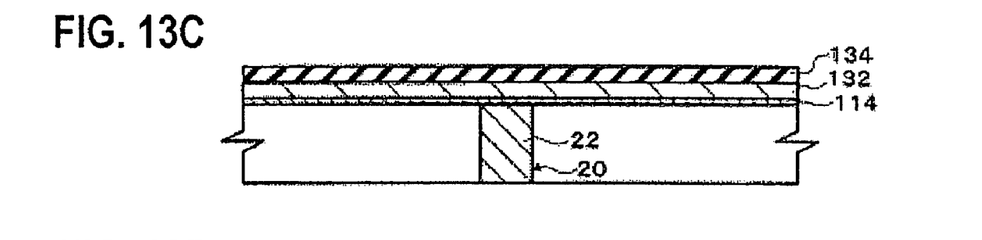
Figure 13D:
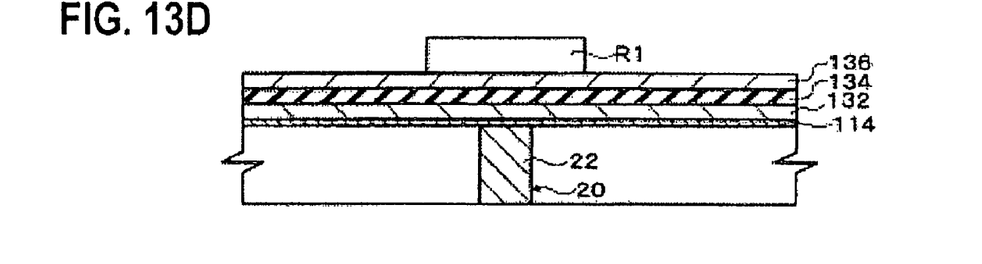

FIG. 12 is a cross-sectional view schematically showing the structure of the semiconductor device 200 obtained in the present comparison example. In FIG. 12, the semiconductor device 200 includes a ferroelectric capacitor 130 including a barrier layer 114, a first electrode 132, a ferroelectric layer 134, and a second electrode 136. FIGS. 13A-1-3D are cross-sectional views schematically showing steps of a process for manufacturing the semiconductor device 200 in accordance with the present comparison example.

Figure 14:
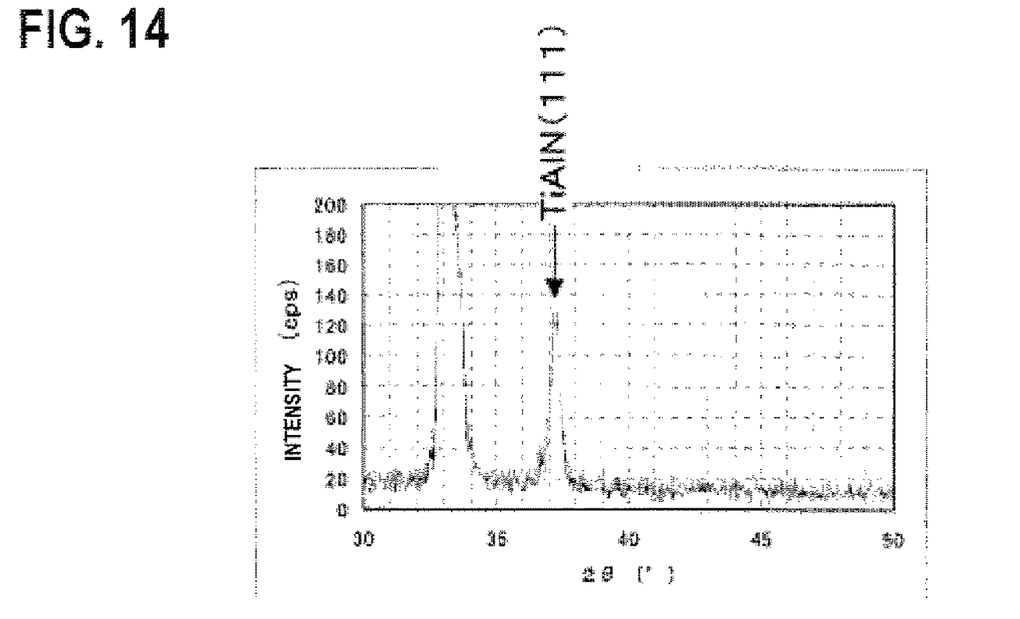
FIG. 14 shows an XRD pattern of a barrier layer (TiAlN layer) formed in Comparison Example 1.
Figure 15:
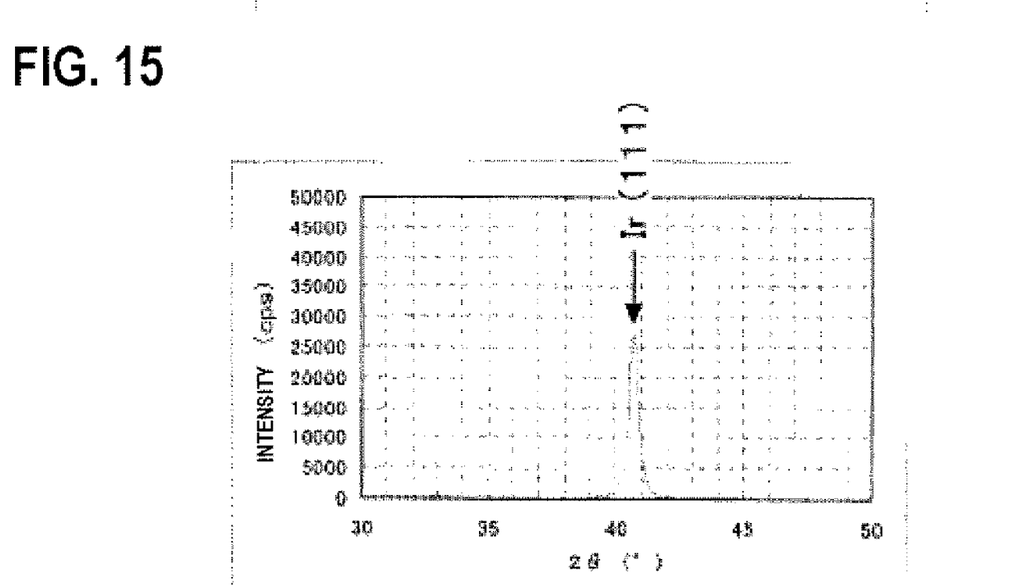
FIG. 15 shows an XRD pattern of a first electrode (Ir layer) forming in Comparison Example 1.

FIG. 14 shows an XRD pattern of the barrier layer (TiAlN layer) 114 formed in accordance with the present comparison example, and FIG. 15 shows an XRD pattern of the first electrode (Ir layer) 132 formed in the present comparison example. According to FIG. 14, the peak intensity of TiAlN composing the barrier layer 114 of the present comparison example was less than 1/10 the peak intensity of TiAlN of the barrier layer 14a of Embodiment Example 1 (see FIG. 5). Also, according to FIG. 15, the peak intensity of Ir composing the first electrode 132 of the present comparison example was less than 1/10 the peak intensity of Ir of the first electrode 32a of Embodiment Example 1 (see FIG. 7).

From the foregoing results, in the semiconductor device 100 in accordance with Embodiment Example 1, the crystal orientation property of the barrier layer and the first electrode is excellent, compared to the semiconductor device 200 of Comparison Example 1, and it is therefore assumed that the semiconductor device 100 has the ferroelectric layer 34 with excellent crystal orientation property. By this, it was confirmed that the semiconductor device 100 in accordance with Embodiment Example 1 excels in hysteresis characteristics.

The embodiments of the invention are described above in detail. However, those skilled in the art should readily understand that many modifications can be made without departing in substance from the novel matter and effects of the invention. Accordingly, those modified examples are also included in the scope of the invention.

For example, the ferroelectric capacitors and the methods for manufacturing the same in accordance with the embodiments of the invention are applicable to, for example, capacitors included in piezoelectric elements and the like.

What is claimed is:

1. A method for manufacturing a semiconductor device, the method comprising the steps of:
   (a) forming a layer consisting of titanium above a substrate;
   (b) forming a barrier layer above the layer consisting of titanium;
   (c) changing the layer consisting of titanium to a titanium nitride layer by conducting a heat treatment in a nitrogen containing atmosphere;
   (d) forming a first electrode above the barrier layer;
   (e) forming a ferroelectric layer above the first electrode; and
   (f) forming a second electrode above the ferroelectric layer, wherein the titanium nitride layer, the barrier layer, the first electrode, and the ferroelectric layer are each formed to have a (111) orientation.

2. A method for manufacturing a semiconductor device according to claim 1, wherein the step (c) is conducted before the step (d).

3. A method for manufacturing a semiconductor device according to claim 1, wherein the step (c) is conducted after the step (d).

4. A method for manufacturing a semiconductor device according to claim 1, wherein the titanium layer is formed to a film thickness of 5 nm to 20 nm in the step (a).

5. A method for manufacturing a semiconductor device according to claim 1, wherein the barrier layer is a layer that includes titanium, aluminum and nitrogen, and the titanium nitride layer is a TiN layer.

6. A method for manufacturing a semiconductor device according to claim 5, wherein the barrier layer has a composition defined as $Ti_{(1-x)}Al_x N_y$ (where x is in a range of $0 < x \leq 0.3$, and y is greater than 0 ($0 < y$)).

7. A method for manufacturing a semiconductor device according to claim 1, wherein, in the step (a), the titanium layer is formed above a plug conductive layer including tungsten.

8. The method of claim 1, wherein the barrier layer is formed of TiAl.

9. The method of claim 1, wherein the barrier layer is formed of TiSiN.

10. The method of claim 1, wherein the barrier layer is formed of TaN.

11. The method of claim 1, wherein the barrier layer is formed of TaSiN.

* * * * *